United States Patent [19]

Nishiguchi et al.

[11] Patent Number: 4,844,325
[45] Date of Patent: Jul. 4, 1989

[54] METHOD AND APPARATUS FOR DIE-BONDING SEMICONDUCTOR CHIP BONDING

[75] Inventors: Masanori Nishiguchi; Takeshi Sekiguchi; Mitsuaki Fujihira, all of Kanagawa, Japan

[73] Assignee: Sumitomo Electric Industries, Ltd., Osaka, Japan

[21] Appl. No.: 168,968

[22] Filed: Mar. 16, 1988

[30] Foreign Application Priority Data

Mar. 18, 1987 [JP] Japan .................................. 62-63214

[51] Int. Cl.$^4$ ............................................. B23K 31/02
[52] U.S. Cl. .................................... 228/180.2; 228/20
[58] Field of Search ..................... 228/20, 180.2, 264, 228/37

[56] References Cited

U.S. PATENT DOCUMENTS

| | | | |
|---|---|---|---|
| 3,705,457 | 12/1972 | Tardoskegyi | 228/37 |
| 4,274,576 | 6/1981 | Shariff | 228/264 |
| 4,295,596 | 10/1981 | Doten et al. | 228/180.2 |
| 4,564,135 | 1/1986 | Barresi et al. | 228/180.2 |
| 4,634,043 | 1/1987 | Avedissian | 228/180.2 |
| 4,752,025 | 6/1988 | Stach et al. | 228/20 |

*Primary Examiner*—M. Jordan
*Attorney, Agent, or Firm*—Cushman, Darby & Cushman

[57] ABSTRACT

A process of die-bonding a semiconductor chip. The semiconductor chip is sucked by a collet and fixed on a preform which is formed on a die pad. A load is applied to the chip and a gas is blown around the semiconductor chip. so as to flatten any of the preform that has gone beyond the interface between the chip and die pad. The entire assembly is heated thereby curing the preform. In a preferred embodiment the semiconductor chip is sucked with the collet via a vacuum pump and an inert gas is blown around the semiconductor chip.

7 Claims, 2 Drawing Sheets

METHOD AND APPARATUS FOR DIE-BONDING SEMICONDUCTOR CHIP BONDING

BACKGROUND OF THE INVENTION

The present invention relates to a novel composition of an apparatus for die bonding which is performed as a step in the process of assembling a semiconductor chip in a package.

In assembling a semiconductor chip in a package, the chip has to be fixed on a die pad at a predetermined location in the package prior to wire bonding and this step is called die bonding.

Die bonding methods are classified into three general types, the eutectic alloy method, the soldering method, and the resin bonding method. In the Au-Si eutectic alloy method, an Au-plated die pad is heated at about 400° C. in a $N_2$ or $N_2+H_2$ atmosphere with the back surface of the Si chip being pressed against the surface of the Au layer so as to form a Au-Si eutectic alloy layer that establishes a bond between the chip and the die pad. In the soldering method, the back surface of a semiconductor chip is metallized with a thin film of Ni-Au or Ti-Ni-Au, and the chip and the substrate metal with a small piece of Pb-Sn solder held therebetween are heated at 200°-300° C. in a $N_2$ or a $N_2+H_2$ atmosphere, thereby bonding the chip to the die pad. The resin bonding method is a fairly new technique and employed having the particles of an electroconductive material (e.g. Ag) dispersed therein. The adhesive resin is coated on the die pad by either stamping or with a dispenser and the chip temporarily fixed on the die pad by pressing is heated so as to cure the resin. In each of these methods of die bonding, the chip is properly positioned and fixed on the die pad by being sucked with a collet (grip means) while, the chip is connected to the package electrically or thermally.

In the die bonding methods described above, the chip sucked with the collet is thermally compressed to a preform (e.g. Au/Si layer, brazing filler material or epoxy resin) on the die pad, but this often causes the preform to go beyond the interface between the chip and the die pad and either solidify in ball form around the chip or climb the lateral side of the chip soiling the device in either case.

SUMMARY OF THE INVENTION

An object, therefore, of the present invention is to provide an apparatus that is capable of die-bonding a semiconductor chip without soiling it.

This object and other objects of the present invention can be attained by a die bonding apparatus that essentially includes a collet comprising a semiconductor chip gripping section having a cavity so shaped as to enable the gripping of a semiconductor chip; an aspiration hole communicating with a space defined by the cavity and the semiconductor chip; exhaust means communicating with the aspiration hole and which allows the semiconductor chip to be vacuum-sucked into the cavity in said collet; and gas supply means communicating with said aspiration hole in said collet. This apparatus is so designed as to be capable of selectively performing the following operations: (i) evacuating the space defined by said cavity in said collet and allowing the semiconductor chip to be vacuum-sucked into the said cavity, and (ii) blowing a gas from the space to the area around the semiconductor chip.

DETAILED DESCRIPTION OF THE PREFERRED EMBODIMENT

A preferred embodiment of the die-bonding apparatus of the present invention is hereinafter described in detail with reference to the accompanying drawings.

Figure 1A:
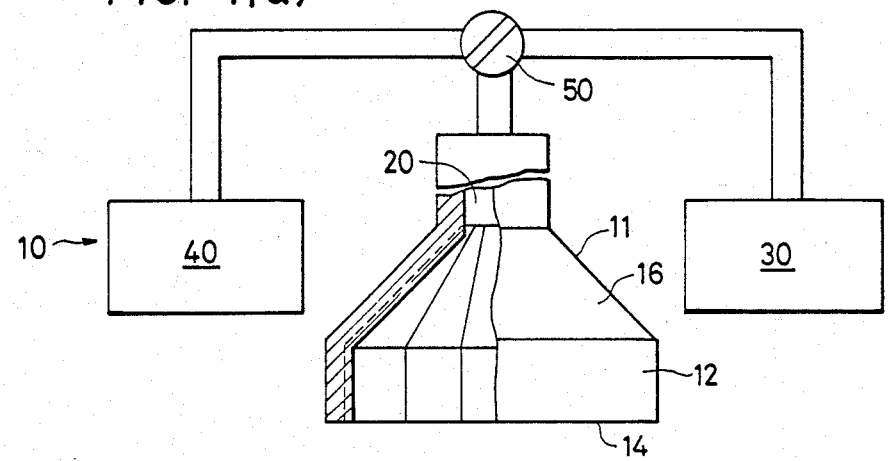
FIG. 1(a) is a fragmentary side view of the collet in a die-bonding apparatus according to one embodiment of the present invention.
Figure 1B:
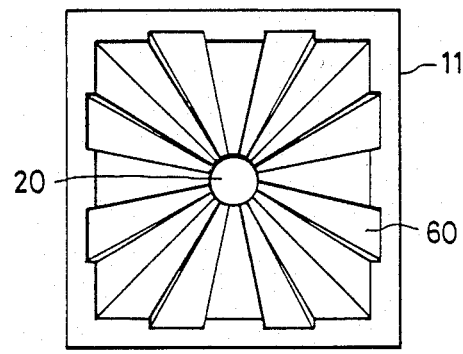
FIG. 1(b) is a plan view of the collet as seen from below.

FIG. 1(a) is a fragmentary side view of the collet 11 in a die-bonding apparatus 10 according to one embodiment of the present invention, and FIG. 1(b) is a plan view of the collet 11 as seen from below.

As shown in FIGS. 1(a) and (b), the die-bonding apparatus 10 of the present invention is equipped with a collet 11 having a cavity 12 with a rectangular shape complementary to the profile of a semiconductor chip to be bonded to the die pad 90. As FIG. 1(a) shows, the cavity 12 in the collet 11 with one end open is continuous to a communicating hole 20 via the pyramid-shaped portion 16, and the communicating hole 20 is connected via a switching valve 50 to both a vacuum pump 30 which effects vacuum suction and to a supply source 40 of a gas to be blown. As shown in FIG. 1(b), the open end 14 of the cavity 12 in the collet 11 as seen from the front is provided with a plurality of vacuum sucking and gas blowing grooves 60 formed around a central tubular hollow portion 20.

Figure 2A:
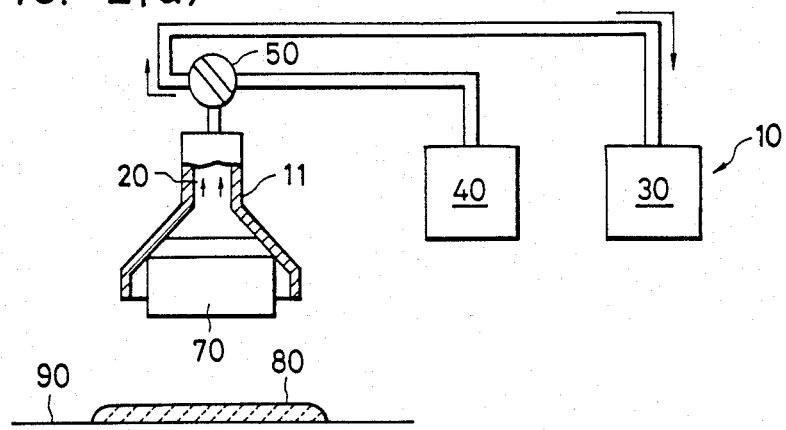
FIG. 2(a-c) shows the sequence of performing die-bonding with the apparatus of the present invention.

FIG. 2 shows the sequence of performing die-bonding with the apparatus of the present invention. As shown in FIG. 2(a), the process starts with coating a Ag-containing epoxy resin as a preform 80 on the die pad 90 either by stamping or with a dispenser. Thereafter, the valve 50 is so adjusted as to establish communication between the vacuum pump 30 and the collet 11 and the semiconductor chip 70 is held in position in the collet 11 by vacuum suction create with the vacuum pump 30.

Figure 2B:
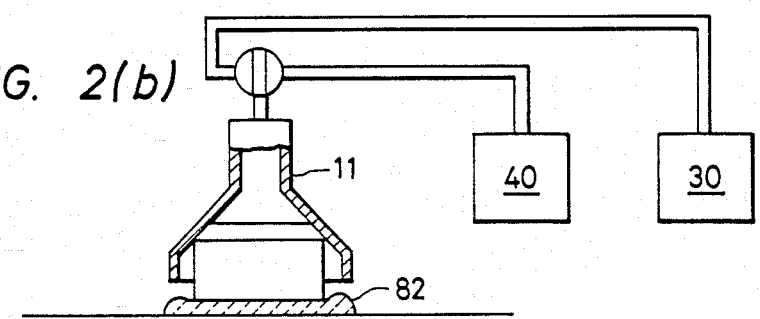
Figure 2C:
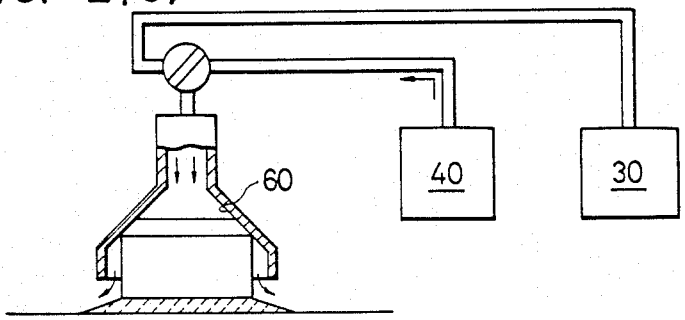

The collet 11 holding the chip 70 is then moved to a position right above the preform 80 and lowered down so that the chip 70 is fixed on the preform 80 as shown in FIG. 2(b). Thereafter, as shown in FIG. 2(c), with a load being applied to the chip 70, the valve 50 is switched to establish communication between the gas supply source 40 and the collet 11. An inert gas such as $N_2$ is supplied through the hollow portion 20 and the grooves 60 in the collet 11 and blown against that part 82 of the preform 80 that has gone beyond the interface between the chip 70 and the die pad 90. During the $N_2$ blowing, the assembly is heated so as to cure the preform. As a result of this blowing step, any raised part 82 of the preform 80 that has gone beyond the interface between the chip 70 and the die pad 90 will become flat.

As described above, according to the present invention, the collet 11 is connected to the gas supply source 40 via the communicating hole 20 and a suitable gas is blown from the supply source 40 against the part 82 of the preform 80 that has gone beyond the interface between the chip 70 and the die pad 90, thereby preventing the soiling of the device. In the embodiment just described, $N_2$ is used as the gas to be blown and this offers the additional advantage that a $N_2$ gas layer is formed on the preform 80 so as to prevent its oxidation however any suitable gas may be used.

An embodiment of the present invention has been described with reference to die bonding by the use of an electroconductive resin. It should, however, be noted that the apparatus of the present invention can also be used when die bonding is performed by the Au-Si eutectic alloy method or the solder method and as in the case of the illustrated embodiment, the soiling of the device can be prevented.

In the Au-Si eutectic alloy method and the soldering method, the preform 80 is heated to a fluid state. If a suitable gas is blown against this molten preform 80 in accordance with the present invention, the chip 70, preform 80 and the die pad 90 will be cooled fast enough to realize rapid bonding between the chip 70 and the die pad 90.

In the foregoing embodiment, the collet 11 is shaped like a pyramid but equally good results can be attained by employing a bidirectional collet.

As described on the foregoing pages, the process of die bonding with the apparatus of the present invention consists of sucking a semiconductor chip 70 with suction means, fixing the chip 70 on the surface of a certain die pad 90 with a preform 80 being placed between the die pad 90 and the semiconductor chip 70, and blowing a gas against the preform 80. As a result of this blowing step, any raised part 82 of the preform 80 that goes beyond the interface between the chip 70 and the die pad 90 will become flat without solidifying in ball form or climbing the lateral side of the chip 70. In other words, the soiling of the device which has a frequent problem in the prior art can be prevented.

In the Au-Si eutectic alloy method and the soldering method the heated preform 80 is rapidly cooled with the blown gas and the chip 70 and the die pad 90 can be bonded at an increased speed.

If an inert gas or forming gas such as $N_2$ is blown against the preform 80, an additional advantage is offered in that a $N_2$ gas layer is formed on the preform 80 to prevent its oxidation.

Although the invention has been described in connection with what is presently considered to be the most practical and preferred embodiment, it is to be understood that the invention is not limited to the disclosed embodiment but, on the contrary is intended to cover various modifications and equivalent arrangements included within the spirit and scope of the appended claims. Therefore, persons of ordinary skill in this field are to understand that all such equivalent structures are to be included within the scope of the following claims.

What is claimed is:

1. An apparatus for die-bonding a semiconductor chip comprising:

a collet comprising a semiconductor chip grip section having a cavity so shaped as to enable the gripping of a semiconductor chip and having an aspiration hole therein communicating with a space defined by the cavity and the semiconductor chip;

exhaust means that communicate with the aspiration hole vacuum-sucking the semiconductor chip into the cavity in the collet; and gas supply means communicating with the aspiration hole in the collet for blowing a gas from the space to an area around the semiconductor chip, the blowing of gas, causing any raised part of the preform bonding resin that goes beyond the interface between the chip and the die pad to be flattened without solidifying in a ball form or climbing the lateral sides of the chip thereby preventing soiling of the chip.

2. A die-bonding apparatus according to claim 1 wherein said gas supply means supplies an inert gas or a forming gas.

3. A die-bonding apparatus according to claim 1 or 2 wherein said collet is a hollow member having a rectangular cross section with grooves cut in its inner surface.

4. A method of die-bonding a semiconductor chip comprising the steps of:

coating an Ag containing epoxy resin as a preform on a die pad;

gripping a semiconductor chip in a collet;

fixing the semiconductor chip on the preform;

applying a load to the chip;

supplying a gas flow to an area around the semiconductor chip to flatten any raised parts of the preform that goes beyond the interface between the chip and the die pad so it will not solidify in a ball form or climbing the lateral sides of the chip thereby preventing soiling; and curing the preform.

5. A method as in claim 4 wherein said gripping step comprises the step of vacuum sucking the semiconductor chip into a cavity in the collet.

6. A method as in claim 5 wherein said curing step comprises the step of heating the preform.

7. A method for preventing the soiling of semiconductor chips during the die bonding process comprising the steps of:

placing the semiconductor chip onto a preform to mount it to a die pad;

applying pressure so as to adhere the chip to the die pad; and blowing gas onto an area around the semiconductor chip in order to flatten any raised parts of the preform that goes between the chip and the die pad so as to prevent the formation of any preform balls and to prevent the preform from climbing the lateral sides of the chip.

* * * * *